United States Patent
Lee

(10) Patent No.: US 8,207,566 B2
(45) Date of Patent: Jun. 26, 2012

(54) VERTICAL CHANNEL TRANSISTOR AND METHOD OF FABRICATING THE SAME

(75) Inventor: Chun-Hee Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 13/071,182

(22) Filed: Mar. 24, 2011

(65) Prior Publication Data

US 2011/0169074 A1  Jul. 14, 2011

Related U.S. Application Data

(62) Division of application No. 12/336,474, filed on Dec. 16, 2008, now Pat. No. 7,935,598.

(30) Foreign Application Priority Data

Dec. 24, 2007 (KR) .................. 10-2007-0136439
Nov. 12, 2008 (KR) .................. 10-2008-0112226

(51) Int. Cl.
*H01L 27/108* (2006.01)
*H01L 29/94* (2006.01)

(52) U.S. Cl. .............. 257/302; 257/328; 257/E21.41; 438/156; 438/173; 438/192; 438/206; 438/212

(58) Field of Classification Search .............. 438/156, 438/173, 192, 206, 212, 268, 589; 257/E21.41, 257/302, 328

See application file for complete search history.

(56) References Cited

U.S. PATENT DOCUMENTS

| | | | |
|---|---|---|---|
| 5,929,477 | A | 7/1999 | McAllister Burns, Jr. et al. |
| 7,531,874 | B2 * | 5/2009 | Son et al. ............... 257/334 |
| 2007/0075359 | A1 | 4/2007 | Yoon et al. |
| 2009/0170302 | A1 | 7/2009 | Shin et al. |

FOREIGN PATENT DOCUMENTS

| | | |
|---|---|---|
| KR | 100618875 | 8/2006 |
| KR | 1020070058906 | 6/2007 |
| KR | 100762907 | 9/2007 |
| KR | 100771871 | 10/2007 |
| KR | 1020080011491 | 2/2008 |

OTHER PUBLICATIONS

Korean Office Action for 10-2008-0112226, citing the above reference(s).
Korean Notice of Allowance for 10-2008-0112226 dated Oct. 28, 2011 citing the above reference(s).

* cited by examiner

*Primary Examiner* — Jarrett Stark
*Assistant Examiner* — John M Parker
(74) *Attorney, Agent, or Firm* — Lowe Hauptman Ham & Berner, LLP

(57) ABSTRACT

A vertical channel transistor includes a plurality of active pillar patterns extending perpendicularly from the top surface of the substrate toward an upper part. A gate insulating layer is deposited on the side wall of the active pillar pattern and serves as an ion diffusion barrier between the pillar patterns and surrounding lower gate electrodes. The resultant pillar pattern structure is encapsulated with a metal. The resultant pillar pattern is surrounded on all sides by a specified height by a sacrificial layer of Spin-On Dielectric (SOD). The metal layer is etched-back to the height of the sacrificial layer, thus forming the lower gate electrodes. A spacer layer of an insulating mater is deposited surrounding the upper part of the pillar patterns and the sacrificial layer is removed exposing a part of the lower gate electrodes. The exposed gate electrode is etched to facilitate semiconductor integration.

8 Claims, 7 Drawing Sheets

VERTICAL CHANNEL TRANSISTOR AND METHOD OF FABRICATING THE SAME

CROSS-REFERENCES TO RELATED APPLICATIONS

The present application claims priority of Korean patent application numbers 10-2007-0136439 and 10-2008-0112226, filed on Dec. 24, 2007, and Nov. 12, 2008, and is a Divisional Application of U.S. Ser. No. 12/336,474, filed on Dec. 16, 2008, respectively, which is incorporated herein by reference in their entirety.

BACKGROUND

One or more embodiments relate to a method of fabricating a semiconductor device, and more particularly, to a vertical channel transistor within the semiconductor device and a method of fabricating the same.

Recently, the integration density of semiconductor memory devices, particularly in Dynamic Random Access Memory (DRAM), has been increased and is now approaching a gigabit of memory. The gigabit DRAM device is comprised of a plurality of unit cells, each unit cell requiring a pitch of $4F^2$ (wherein F denotes the minimum feature size). Upon increasing the integration density of the semiconductor device, the size of a transistor constituting a unit cell should be decreased.

The structure of a typical planar-type Metal Oxide Semiconductor (MOS) transistor includes a gate electrode formed on the upper part of the semiconductor substrate and a junction formed within the substrate on both sides of the gate electrode. Accordingly, it is difficult to achieve a planar-type MOS transistor having a unit cell of $4F^2$ despite having a scaled channel length.

A vertical channel transistor structure has been proposed as a means to overcome the limitations of integrating planar-type MOS transistors.

FIG. 1 is a cross-sectional view showing the detail of a gate electrode of a conventional vertical channel transistor.

As shown in FIG. 1, the conventional vertical channel transistor includes an active pillar pattern 106 having a top pillar pattern 106A and a neck pillar pattern 106B. The neck pillar pattern 106B is a channel part of the transistor, and the top pillar pattern 106A is a drain part of the transistor. A poly-silicon gate electrode 112 is formed by interposing a gate oxide layer 110 surrounding the sidewalls of the neck pillar pattern 106B. A capping layer 108 is formed encapsulating the top pillar pattern 106A and a hard mask pattern 104.

The active pillar pattern 106 is formed by isotropic and anisotropic etching of the silicon substrate 102, while using the hard mask pattern 104 as an etch barrier layer. The poly-silicon gate electrode 112 is formed by depositing a layer of poly-silicon on the resultant pillar pattern structure and, then, etching-back the layer of poly-silicon, while leaving the gate electrode formed in the recesses of the nick pillar pattern 106B.

One of the problems with the conventional vertical channel transistor of FIG. 1 is that the etching may not be properly performed when etching the poly-silicon for a gate patterning. Thus, poly-silicon residue may accumulate to form a bridge between the pillar patterns. This becomes a more serious problem with increased density of the pillar pattern due to increased integration density.

Over-etching is another potential problem with the fabrication of the vertical channel transistor of FIG. 1. As a means for preventing the bridge generation, the poly-silicon layer may be etched too deeply, opening a lower gate oxide layer and partial etching of the substrate below. Thus, a punch phenomenon can occur.

Furthermore, because the gate is made of poly-silicon, a high gate resistance becomes a problem as the density of the resultant structure is increased. That is, characteristics, i.e. conductivity, of the vertical channel transistor begin to degrade.

SUMMARY

One or more embodiments have been proposed in order to overcome the above-described problems with the prior art vertical channel transistors. One or more embodiments are directed to providing a vertical channel transistor with decreased gate resistance by applying a metal to a gate.

One or more embodiments are directed to providing a vertical channel transistor and a method of fabricating the vertical channel transistor capable of stabilizing a following process of manufacture by forming a straight bar-type pillar pattern.

Still one or more embodiments are directed to providing a method of fabricating a vertical channel transistor capable of forming a metal gate with a stabilized process of manufacture.

In accordance with one or more embodiments, there is provided a vertical channel transistor, which includes: a plurality of active pillar patterns extending perpendicularly from a substrate toward an upper part; and a plurality of metal gate electrodes formed by interposing gate insulating layers on sidewalls of the active pillar patterns.

Each of the active pillar patterns may include a channel active pillar pattern unit in a lower part and a drain active pillar pattern unit in an upper part, and the metal gate electrodes may be formed surrounding sidewalls of the channel active pillar pattern units. The channel active pillar pattern unit and the drain active pillar pattern unit may have a substantially uniform line width, and the active pillar pattern may have a straight cylindrical shape. The line width of the channel active pillar pattern unit may be formed narrower than the line width of the drain active pillar pattern unit.

The vertical channel transistor may further include a hard mask patterns formed above an upper part of the drain active pillar pattern unit. The vertical channel transistor may further include spacers formed surrounding the sidewalls of the hard mask pattern and the drain active pillar pattern unit. Each of the metal gate electrodes may include a barrier metal formed in contact with the gate insulating layer. The metal gate electrode may be made of any material selected from a group consisting of Ta, Ti, TiN, $TiB_2$, TaN and TaSiN and a combination thereof.

In accordance with another embodiment, there is provided a method of fabricating a vertical channel transistor, the method including: forming a plurality of active pillar patterns by etching a substrate; forming a metal for a gate surrounding an upper part of a resultant pillar pattern structure; forming a sacrificial layer which completely fills a space between the active pillar patterns; partially etching the metal to a height of the sacrificial layer; forming a spacer on a sidewall of an upper part of the active pillar pattern exposed by the partial etching of the metal; removing the sacrificial layer; and performing a gate separation by etching the metal exposed by the removal of the sacrificial layer.

The active pillar pattern may be formed into a straight cylindrical shape. The width of an upper part of the active pillar pattern may be formed wider than the width of a lower part of the active pillar pattern.

A Spin-On-Dielectric (SOD) may be used as the sacrificial layer. The metal may include a barrier metal and an electrode metal.

DESCRIPTION OF EMBODIMENTS

In order to describe in detail such that those skilled in the art easily implement the spirit and scope of one or more embodiments, the embodiments will be described with reference to the accompanying drawings.

Figure 1:
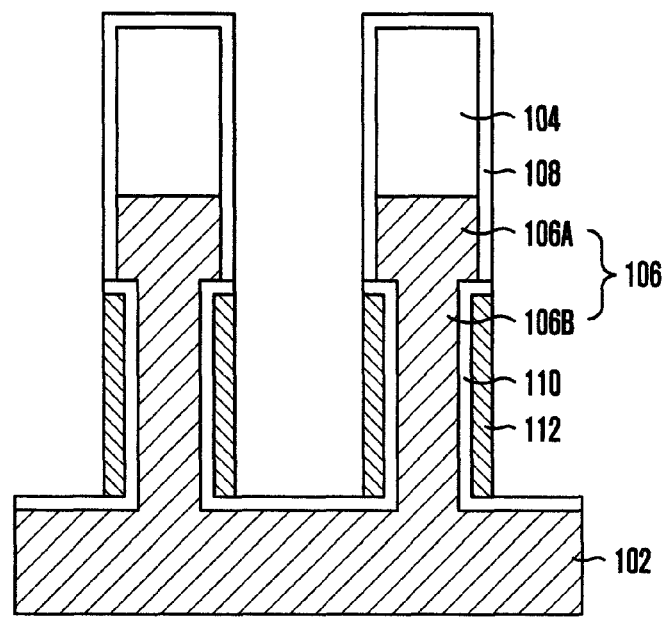
FIG. 1 is a cross-sectional view showing a gate electrode of a conventional vertical channel transistor.
Figure 2:
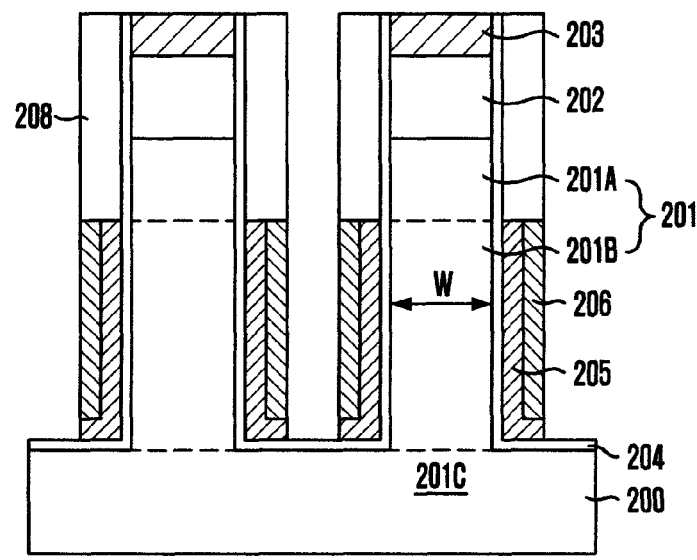
FIG. 2 is a cross-sectional view depicting a gate structure of a vertical channel transistor in accordance with one embodiment.

FIG. 2 is a cross-sectional view depicting a gate structure of a vertical channel transistor in accordance with one embodiment.

The vertical channel transistor in accordance with the embodiment includes an active pillar pattern 201 which provides an active of the transistor. The upper part of the active pillar pattern 201 is the drain active pillar pattern 201A of the transistor and the lower part of the active pillar pattern 201 is the channel active pillar pattern 201B of the transistor. The active pillar pattern 201 has a cylindrical shape where the channel active pillar pattern 201B and the drain active pillar pattern 201A have substantially the same line width W. A substrate below the channel active pillar pattern 201B is a source region 201C.

The active pillar pattern 201 is formed by anisotropically etching a silicon substrate 200 using a hard mask pattern 202 and 203 as a protective barrier layer. The hard mask pattern is formed by depositing an oxide layer 202 and a nitride layer 203. Alternatively, the hard mask pattern can be formed of a thin film material, such as a polymer. The hard mask pattern can be deposited as a single-layer or multi-layered with different materials. The multi-layered hard mask pattern is used to overcome the problems associated with the manufacturing process, which will hereafter be explained in detail.

A gate oxide layer 204 is interposed between a metal gate 205 and 206 and the sidewalls of the channel active pillar pattern 201B. The metal gate is formed by depositing a barrier metal 205 of TaN and an electrode 206 of TiN. The barrier metal can also be omitted if desired. While the electrically conductive TiN exemplifies the metal used as the electrode, another type of metal can be used in a single-layer or multi-layered form. For instance, the metal can be any material selected from a group consisting of Ta, Ti, TiN, $TiB_2$, TaN and TaSiN and combinations thereof.

Accordingly, by forming the gate electrode of the vertical channel transistor out of a metal, the resistance can be lowered, thereby improving the characteristics of the transistor. On the sidewall of the drain active pillar pattern 201A and extending to the sidewall of the hard mask pattern 202 and 203, a spacer 208 is formed surrounding thereon and is made of an insulating layer, such as a nitride layer.

As shown in FIG. 2, the gate oxide layer 204 extends perpendicularly from the substrate to surround the drain active pillar pattern 201A and the hard mask pattern 202 and 203. To this extent, the oxide layer 204 serves as a capping layer to the drain active pillar pattern and the hard mask pattern.

Also, the cylindrical shape of the pillar pattern stabilizes the fabrication process for the gate, which will be explained in detail hereafter.

FIGS. 3A to 3I are cross-sectional views illustrating a method of fabricating the improved vertical channel transistor shown in FIG. 2.

Figure 3A:
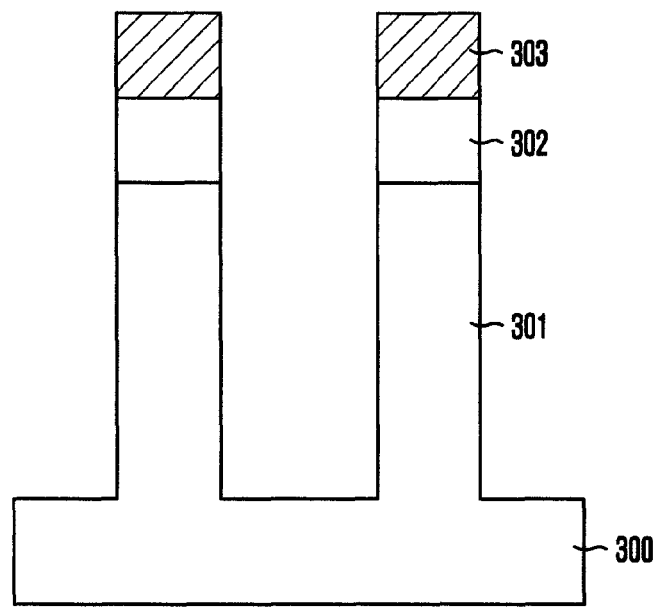
FIGS. 3A to 3I are cross-sectional views illustrating a process of forming the gate of the vertical channel transistor in accordance with the embodiment of FIG. 2.
Figure 5:
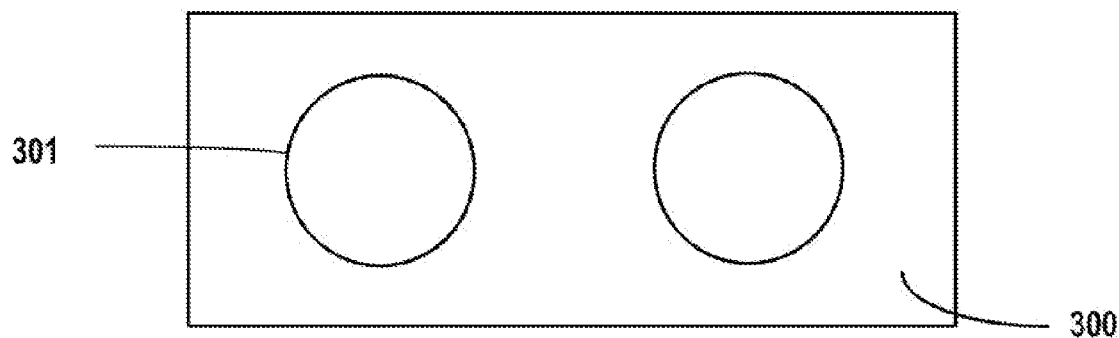
FIG. 5 is a top view illustrating the substrate and the active pillar pattern in accordance with the embodiment of FIG. 3A.

As shown in FIG. 3A, an active pillar pattern 301 is formed by anisotropically etching a substrate 300 using a hard mask pattern 302 and 303 as an etching barrier. This anisotropic etch gives the pillar pattern 301 its cylindrical shape as shown in FIG. 5. In the embodiment, the hard mask pattern has a multi-layered structure where an oxide layer 302 and a nitride layer 303 are deposited. Alternatively, the hard mask pattern can be made of other materials, such as polymer. The multi-layered hard mask pattern functions as an etching barrier for subsequent etching processes of a silicon layer, a Silicon On Dielectric (SOD), a nitride layer, a metal, etc.

Figure 3B:
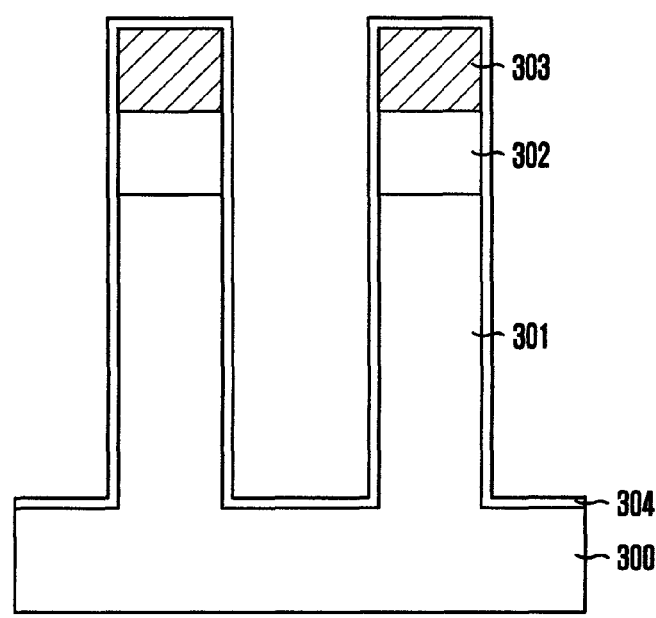

As shown in FIG. 3B, an oxide layer 304 is formed, by an oxidizing process, encapsulating the entire exterior surface of the active pillar pattern 301 and covering the top surface of the substrate. In this case, the oxide layer 304 simultaneously functions as both a gate insulating layer and a capping layer. Thermal oxidization, plasma oxidization or the like are used during formation of the oxide layer 304.

Figure 3C:
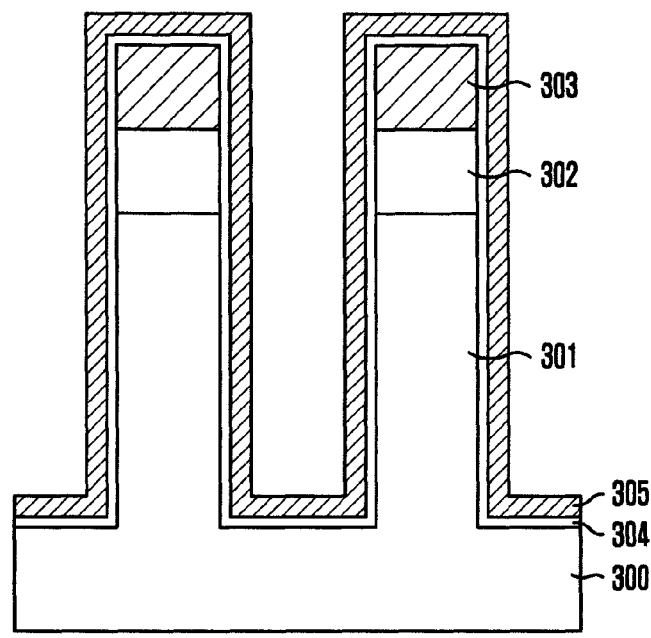

As shown in FIG. 3C, a barrier metal 305, made of TaN is deposited fully encapsulating the resultant pillar pattern structure. The barrier metal 305 prevents mutual atom diffusion between a silicon and the metal used as the electrode and enhances a mutual adhesive strength between the metal and the silicon.

Figure 3D:
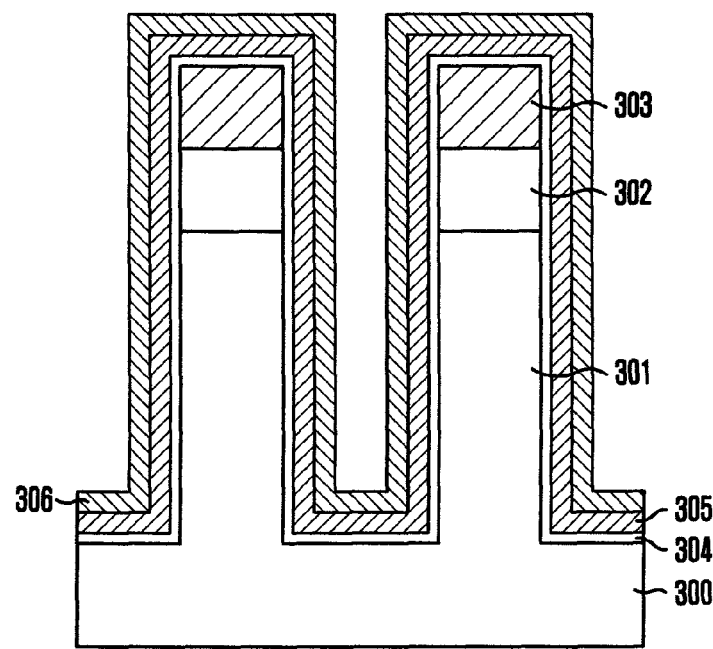

As shown in FIG. 3D, an electrode 306 made of TiN is deposited to fully encapsulate the resultant pillar pattern structure.

Figure 3E:
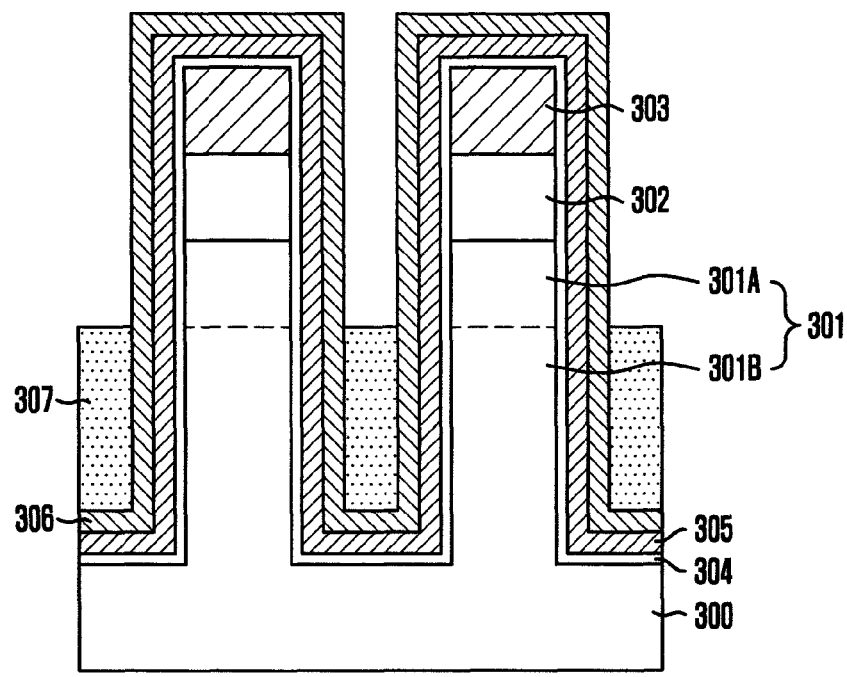

As shown in FIG. 3E, a Spin-On-Dielectric (SOD) 307 is deposited surrounding the resultant pillar pattern structure. The SOD 307 functions as a sacrificial layer for lowering etching target of a gate metal. The SOD 307 has excellent gap-fill characteristics and thus can sufficiently fill a space between the pillar patterns. Alternatively, other sacrificial layers having excellent gap-fill characteristics can also be used. Thereafter, the SOD 307 is etched-back accordingly to satisfy the desired height for the lower electrode. That is, the SOD 307 is removed from the sidewall part of the drain active pillar pattern 301A and the SOD 307 remains on the sidewall part of the channel active pillar pattern 301B.

Figure 3F:
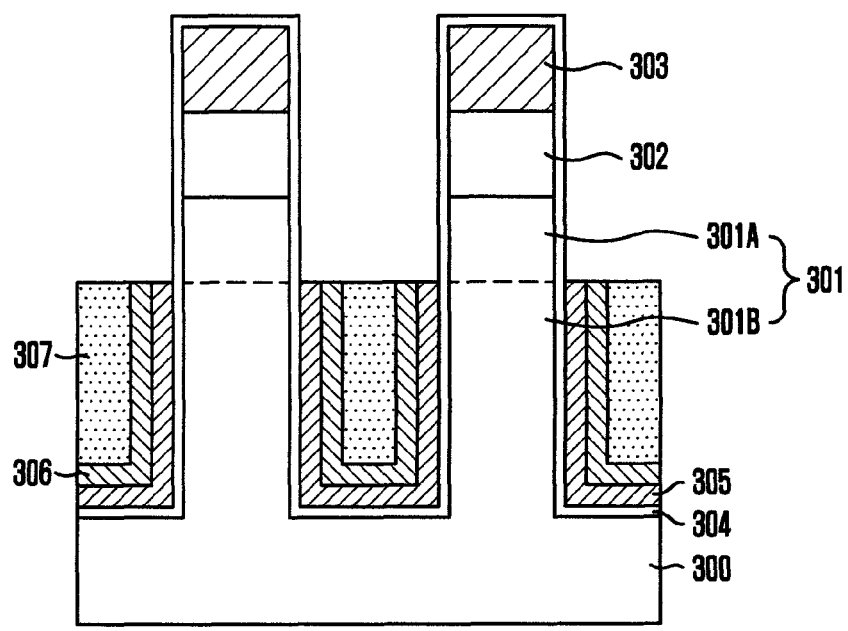

As shown in FIG. 3F, the lower electrode 306 and the barrier metal 305 are exposed by etching back the SOD 307.

Figure 3G:
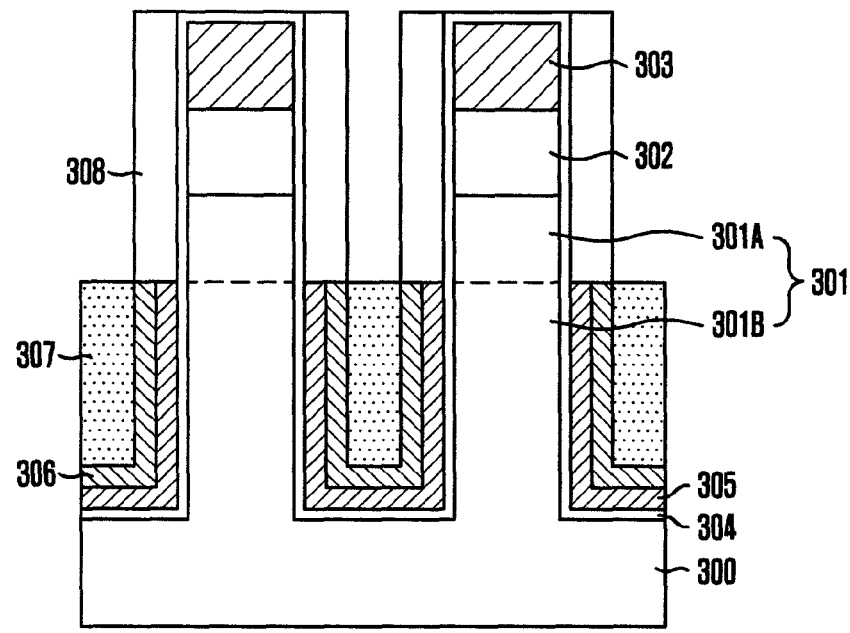

As shown in FIG. 3G, a spacer 308 is formed by depositing an insulating layer, such as nitride, and anisotropically whole surface-etching the nitride layer without a mask. Thereby, the etched-back SOD 307 is exposed. The spacer 308 protects the upper part of the pillar pattern.

Figure 3H:
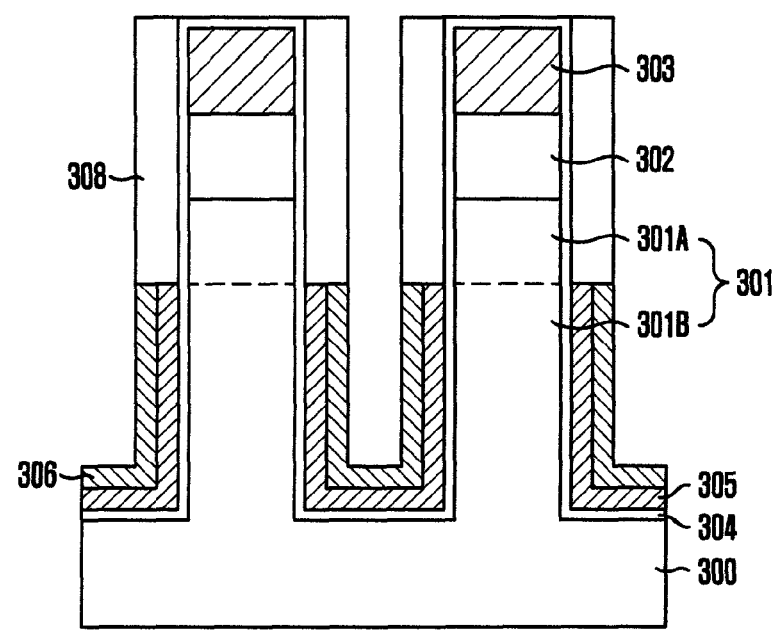

As shown in FIG. 3H, the exposed SOD 307 is removed. The removal of the SOD 307 can be performed through wet-etching.

Figure 3I:
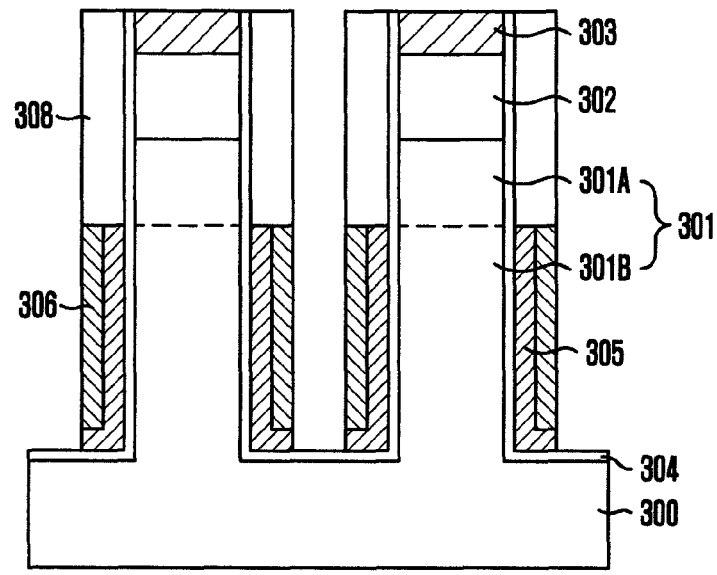

As shown in FIG. 3I, the portions of the electrode 306 and barrier metal 305 exposed by the removal of the SOD 307 are etched so that gate separation between neighboring cells is effectively accomplished.

As above-described, after the pillar pattern is formed to a cylindrical shape, the metal gate is formed surrounding its sidewalls according to the method of fabricating the vertical channel transistor in accordance with the embodiment. In addition, after depositing the metal, the metal is partially etched to provide the metal gate separation.

As a result of the metal previously being partially etched, the etch target of the metal for the metal gate separation is as small as the partially etched amount. Therefore, over-etching into the gate oxide layer and the substrate can be prevented. Thus, defects in the fabricating process such as residual, bridge and punch can be prevented. That is, the fabrication process is stable.

Figure 4:
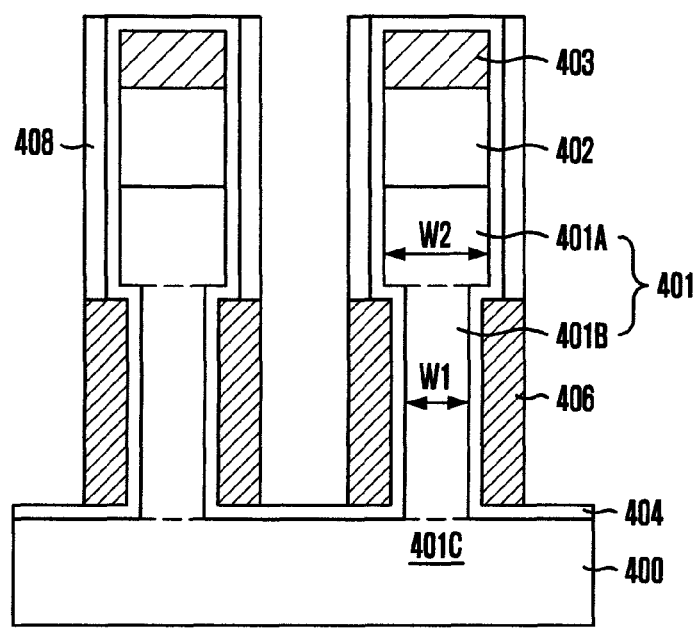
FIG. 4 is a cross-sectional view illustrating a gate structure of a vertical channel transistor in accordance with another embodiment.

FIG. 4 is a cross-sectional view showing a vertical channel transistor in accordance with another embodiment.

The vertical channel transistor in accordance with the embodiment includes an active pillar pattern 401 which provides for an active transistor. The upper part of the active pillar pattern 401 becomes a drain active pillar pattern 401A of the transistor and the lower part becomes a channel active pillar pattern 401B of the transistor. Herein, a line width W1 of the channel active pillar pattern 401B is narrower than the line width W2 of the drain active pillar pattern 401A. A substrate below the lower part of the channel active pillar pattern 401B is a source region 401C.

The active pillar pattern 401 is formed by etching a silicon substrate 400 using a hard mask pattern 402 and 403 or the like as an etch barrier layer. At this time, a combination of isotropic and anisotropic etching can be used. The hard mask pattern is a multi-layered deposition of an oxide layer 402 and a nitride layer 403. Herein, other materials, such as a polymer, can also be used as the hard mask pattern.

A gate oxide layer 404 is interposed between the sidewall of the channel active pillar pattern 401B and a metal gate 406. In the same manner with the previously explained embodiment, the metal gate can include a barrier metal.

A spacer 408 is formed of an insulating layer, e.g. a nitride layer and surrounding the sidewalls of the drain active pillar pattern 401A and the hard mask pattern 402 and 403. The gate oxide layer 404 extends perpendicularly from the top surface of the substrate along the sidewalls of the drain active pillar pattern 401A and the hard mask pattern. Accordingly, the oxide layer 404 serves as a capping layer to the drain active pillar pattern 401A and the hard mask pattern.

As above-described, the active pillar pattern 401 included in the vertical channel transistor in accordance with this embodiment is not cylindrical shaped as in previous embodiments; however, these structures are substantially equivalent. In addition, the method of fabricating the vertical channel transistor is the same with the exception of the pillar pattern formation process. Thus, this embodiment has the same effect, i.e., the same improvements, the same characteristics and the same advantages in fabrication of the transistor, as in the previous embodiment.

One or more embodiments can improve characteristics of the vertical channel transistor by decreasing a gate resistance and solving a gate depletion effect (doping depletion phenomenon of a poly-silicon). These improvements result from forming a gate using a metal instead of poly-silicon during fabrication of the vertical channel transistor.

Also, in accordance with one or more embodiments, since a metal gate is formed on the sidewall of an active pillar pattern after the active pillar pattern is formed into a cylindrical shape, defining the metal gate is easy.

Also, in accordance with one or more embodiments, after depositing a metal, the metal is partially etched back using a sacrificial layer as an etch stop and, thereafter, a metal gate separation process (gate separation between neighboring transistors) is carried out. Therefore, an etching through the gate oxide layer and punching the substrate can be prevented; thus, a defect in fabrication such as generation of a bridge can be prevented. That is, in accordance with one or more embodiments, the fabrication process is stable.

While the embodiments have been described, it will be apparent to those skilled in the art that various changes and modifications may be made.

What is claimed is:

1. A vertical channel transistor, comprising:
   a plurality of active pillar patterns extending perpendicularly from a top surface of the substrate toward an upper part, each of the active pillar patterns having an upper part and a lower part;
   a plurality of metal gate electrodes formed by interposing gate insulating layers on sidewalls of the active pillar patterns;
   a hard mask pattern formed above the upper parts of the active pillar patterns; and
   spacers formed surrounding the sidewalls of the hard mask pattern and the active pillar patterns.

2. The vertical channel transistor of claim 1, wherein
   each of the active pillar patterns includes a channel active pillar pattern unit in the lower part and a drain active pillar pattern unit in the upper part, and
   the metal gate electrodes are formed surrounding sidewalls of the channel active pillar pattern units.

3. The vertical channel transistor of claim 2, wherein the channel active pillar pattern unit and the drain active pillar pattern unit have a substantially uniform line width, and the active pillar pattern has a straight cylindrical shape.

4. The vertical channel transistor of claim 2, wherein a line width of the channel active pillar pattern unit is formed narrower than a line width of the drain active pillar pattern unit.

5. The vertical channel transistor of claim 3, wherein the hard mask pattern is formed above an upper part of the drain active pillar pattern unit.

6. The vertical channel transistor of claim 5, wherein the spacers are formed surrounding the sidewalls of the hard mask pattern and the drain active pillar pattern unit.

7. The vertical channel transistor of claim 1, wherein each of the metal gate electrodes includes a barrier metal formed in contact with the gate insulating layer.

8. The vertical channel transistor of claim 1, wherein the metal gate electrode is formed of any material selected from the group consisting of Ta, Ti, TiN, $TiB_2$, TaN and TaSiN and a combination thereof.

* * * * *